United States Patent
Imponente et al.

(10) Patent No.: US 10,678,143 B2
(45) Date of Patent: Jun. 9, 2020

(54) PROJECTION SYSTEM MODELLING METHOD

(71) Applicant: ASML Netherlands B.V., Veldhoven (NL)

(72) Inventors: Giovanni Imponente, Eindhoven (NL); Pierluigi Frisco, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/307,372

(22) PCT Filed: May 15, 2017

(86) PCT No.: PCT/EP2017/061565
§ 371 (c)(1),
(2) Date: Dec. 5, 2018

(87) PCT Pub. No.: WO2017/211538
PCT Pub. Date: Dec. 14, 2017

(65) Prior Publication Data
US 2019/0227441 A1    Jul. 25, 2019

(30) Foreign Application Priority Data
Jun. 9, 2016 (EP) .................................... 16173658

(51) Int. Cl.
G03B 27/68     (2006.01)
G03F 7/20      (2006.01)

(52) U.S. Cl.
CPC ............. *G03F 7/705* (2013.01); *G03F 7/706* (2013.01); *G03F 7/70258* (2013.01);
(Continued)

(58) Field of Classification Search
CPC .. G03F 7/705; G03F 7/70258; G03F 7/70525; G03F 7/706;
(Continued)

(56) References Cited

U.S. PATENT DOCUMENTS 6,809,797 B2   10/2004  Baselmans et al.
8,584,055 B2   11/2013  Gyoda et al.
(Continued)

FOREIGN PATENT DOCUMENTS

EP    1 246 014 A1   10/2002
EP    1 251 402 A1   10/2002
(Continued)

OTHER PUBLICATIONS

International Search Report directed to related International Patent Application No. PCT/EP2017/061565, dated Aug. 29, 2017; 4 pages.
(Continued)

*Primary Examiner* — Christina A Riddle
(74) *Attorney, Agent, or Firm* — Sterne, Kessler, Goldstein & Fox P.L.L.C.

(57) ABSTRACT

A projection system model is configured to predict optical aberrations of a projection system based upon a set of projection system characteristics and to determine and output a set of optical element adjustments based upon a merit function. The merit function comprises a set of parameters and corresponding weights. The method comprises receiving an initial merit function and executing an optimization algorithm to determine a second merit function. The optimization algorithm scores different merit functions based upon projection system characteristics of a projection system adjusted according to the output of the projection system model using a merit function having that set of parameters and weights.

12 Claims, 6 Drawing Sheets

(52) U.S. Cl.
CPC ...... *G03F 7/70483* (2013.01); *G03F 7/70491* (2013.01); *G03F 7/70525* (2013.01)

(58) Field of Classification Search
CPC . G03F 7/70483–70541; G03F 7/70266; G03F 7/70308; G03F 7/70191; G03F 7/70891; G03F 7/70833
USPC ........ 355/18, 30, 52, 53, 55, 67–77; 716/51, 716/54; 250/492.1, 492.2, 492.22, 493.1, 250/548; 359/811, 813–830; 430/5, 8, 430/22, 30, 311, 312, 321
See application file for complete search history.

(56) References Cited

U.S. PATENT DOCUMENTS

| | | |
|---|---|---|
| 2001/0053962 A1 | 12/2001 | Yoshida et al. |
| 2002/0052722 A1 | 5/2002 | Yabe |
| 2002/0078429 A1 | 6/2002 | Yoshida |
| 2006/0114437 A1 | 6/2006 | Akhssay et al. |
| 2008/0170212 A1 | 7/2008 | De Winter et al. |
| 2011/0181855 A1* | 7/2011 | Bittner ................ G03F 7/70266 355/55 |
| 2013/0258302 A1* | 10/2013 | Bittner ................ G03F 7/70258 355/67 |
| 2014/0176924 A1 | 6/2014 | Bittner et al. |
| 2015/0181091 A1 | 6/2015 | Myhre et al. |
| 2017/0115576 A1* | 4/2017 | Bittner ................ G03F 7/7015 |

FOREIGN PATENT DOCUMENTS

| | | |
|---|---|---|
| JP | 2012-191018 A | 10/1920 |
| JP | H07-334561 A | 12/1995 |
| JP | H10-240709 A | 9/1998 |
| JP | H11-242690 A | 9/1999 |
| JP | 2002-334835 A | 11/2002 |

OTHER PUBLICATIONS

International Preliminary Report on Patentability and Written Opinion of the International Searching Authority directed to related International Patent Application No. PCT/EP2017/061565, dated Dec. 11, 2018; 7 pages.

Albuquerque et al., "A multi-objective approach in the optimization of optical systems taking into account tolerancing," Proceedings of SPIE—The International Society for Optical Engineering, vol. 8131, Sep. 2011; 9 pages.

Japanese Search Report with English-language translation attached directed to related Japanese Patent Application No. 2018-560932, dated Oct. 30, 2019; 64 pages.

* cited by examiner

PROJECTION SYSTEM MODELLING METHOD

CROSS-REFERENCE TO RELATED APPLICATIONS

This application claims priority of EP application 16173658.2 which was filed on 9 Jun. 2016 and which is incorporated herein in its entirety by reference.

FIELD

The present invention relates to a projection system modelling method. The projection system may form part of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate (e.g. a silicon wafer).

The lithographic apparatus comprises a projection system. The projection system comprises optical elements such as, for example, lenses. Optical aberrations may arise from imperfections in the optical elements. Optical aberrations may also arise from projection effects such as, for example, the heating of optical elements that occurs during a lithographic exposure. Projection system models are used to determine one or more adjustments that may be made to the optical elements of the projection system. The determined adjustments may have the effect of reducing optical aberrations within the projection system.

It may be desirable to provide, for example, a projection system modelling method which obviates or mitigates one or more of the problems of the prior art, whether identified herein or elsewhere.

SUMMARY

Unless otherwise explicitly stated, terms such as first, second, etc. are used as labels and do not impart temporal limitation.

According to a first aspect of the invention, there is provided a computer implemented method for modelling a projection system with a projection system model. The projection system model is configured to predict optical aberrations of a projection system based upon a set of projection system characteristics, and to determine and output a set of optical element adjustments based upon a merit function. The merit function comprises a set of parameters and corresponding weights. The method comprises receiving an initial merit function comprising an initial set of parameters and weights, and executing an optimization algorithm starting from the initial set of parameters and weights to determine a second merit function comprising a second set of parameters and weights. The optimization algorithm scores different sets of parameters and weights based upon projection system characteristics of a projection system adjusted according to the output of the projection system model using a merit function having that set of parameters and weights. The projection system may be adjusted using the optical element adjustments output by the projection system model when executed using the second merit function.

The optimization algorithm may generate other merit functions between the first merit function and the second merit function. The method may be used to thoroughly search across a complex solution space of the projection system model in order to find suitable parameters and weights that improve the performance of the projection system model. The set of parameters may correspond to at least some of the projection system model characteristics. The set of parameters may correspond to projection system model constraints, e.g. a cut-off value of iterations involved in an algorithm or mathematical technique used in the projection system model such as, for example, single value decomposition. An output of the projection system model may comprise residual optical aberrations present in the projection system, in which case, parameters and weights which lead to lower residual optical aberrations may be given better scores by the optimization algorithm. The projection system characteristics need not be optical aberrations and may instead, or additionally, be overlay errors, root mean square wavefront errors, focus errors, optical element adjustment constraints and other characteristics which will be apparent to the skilled person from the teaching herein.

The optimization algorithm may be an evolutionary algorithm having a fitness function, the fitness function being configured to perform the scoring of different sets of parameters and weights.

Other optimization techniques may be used; however, it has been found that using an evolutionary algorithm to find an improved merit function for a projection system model may provide a particularly beneficial solution.

The fitness function may be evaluated and/or changed based upon an output of the projection system model when executed using the second merit function.

Evaluating and/or changing the fitness function based upon an output of the projection system model provides a simple method of monitoring the performance of the evolutionary algorithm and enables improvements to be made to the evolutionary algorithm.

The parameters may comprise terms that may be linearly added to the merit function.

The ability to add terms to the merit function allows greater flexibility in defining a problem to be solved using the optimization algorithm.

At least some of the weights may be assigned to Zernike polynomials and/or Tikhonov variables and/or Gembicki variables.

Finding improved values for weights that are assigned to Zernike polynomials and/or Tikhonov variables and/or Gembicki variables allows the projection system model to output better optical element adjustments resulting in improved projection system characteristics.

The optimization algorithm may determine a Pareto front comprising multiple merit functions, the Pareto front including the second set of parameters and weights.

Providing a Pareto front advantageously increases the choice of optimal solutions available. A user may choose the second set of parameters and weights from the Pareto front.

The method may be applied for adjusting individual optical elements of a projection system.

Adjusting individual optical elements may involve changing an optical element from one configuration to another.

The method may advantageously be used for single optical elements to provide unique adjustments that account for variations between different optical elements, e.g. differences between lenses due to non-identical lens manufacturing processes.

According to a second aspect described herein, there is provided a method for controlling a lithographic apparatus, the lithographic apparatus comprising a projection system, the method comprising: generating a set of projection system adjustments using the method of the first aspect; and adjusting a projection system of a lithographic apparatus in accordance with the projection system adjustments.

A lithographic exposure may be performed on a substrate using the lithographic apparatus after adjusting the projection system.

Performing a lithographic exposure after using the method described herein may advantageously improve the accuracy of the lithographic exposure. For example, the lithographic exposure may have reduced overlay errors and focus errors as a result of the adjustments made to the projection system. Specific improvements to be made to the projection system may be targeted by altering the merit function.

The method may be used for different features that are to be printed on the substrate and/or different layers of the substrate.

Different features may require different projection system characteristics in order to be printed with greater accuracy. Using the method described herein for different features that are to be printed on the substrate and/or layers of a substrate may advantageously improve the accuracy of lithographic exposures.

According to a third aspect described herein, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus further comprises one or more controllers configured to perform the method of the first aspect of the invention and any of its associated options.

According to a fourth aspect described herein, there is provided a computer program product comprising machine readable instructions for causing a processing device to perform the method of the first aspect of the invention and any of its associated options.

Features described in the context of one aspect may be used with other aspects.

BRIEF DESCRIPTION OF THE DRAWINGS

Embodiments of the invention will now be described, by way of example only, with reference to the accompanying schematic drawings, in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system PL. Any use of the terms "reticle" or "mask" herein may be considered synonymous with the more general term "patterning device".

The term "projection system PL" used herein should be broadly interpreted as encompassing various types of projection system PL, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system PL".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system PL and the substrate. Immersion techniques are well known in the art for increasing the numerical aperture of projection systems PL.

Figure 1:
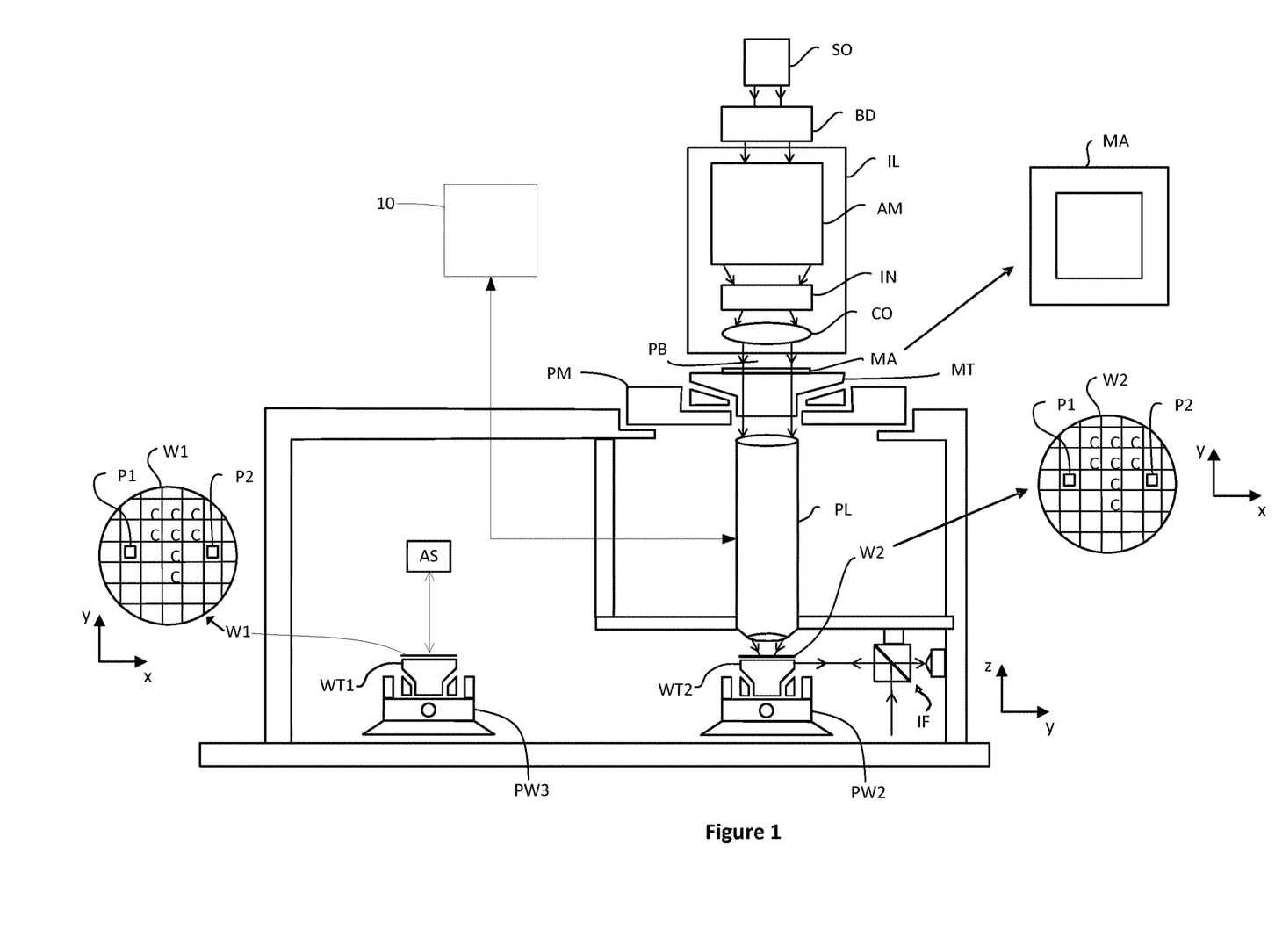
FIG. 1 schematically depicts a lithographic apparatus comprising a computer configured to implement a method according to an embodiment of the invention.

FIG. 1 schematically depicts a lithographic apparatus comprising a projection system PL manipulator according to a particular embodiment of the invention. The apparatus comprises:

a. an illumination system IL to condition a beam PB of radiation (e.g. DUV radiation or EUV radiation).
b. a support structure (which may be referred to as a mask table) MT to support a patterning device (e.g. a mask) MA and connected to first positioning device PM to accurately position the patterning device with respect to a projection system PL;
c. a substrate table (which may be referred to as a wafer table) WT2 for holding a substrate (e.g. a resist coated wafer) W2 and connected to second positioning device PW2 for accurately positioning the substrate with respect the projection system PL;
d. another substrate table WT1 for holding a substrate W1 and connected to third positioning device PW3 for accurately positioning the substrate with respect to alignment system AS; and
e. the projection system PL (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure. The projection system PL is provided on the right-hand side of the figure. The alignment system AS measures the positions of alignment marks provided on a substrate W1 (schematically depicted by boxes P1, P2) which is held on a first substrate table WT1. A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed using patterned radiation projected by the projection system PL. The already exposed wafer W2 supported by the second substrate table WT2 is removed from the substrate table for subsequent processing. Another substrate is then placed on the second substrate table WT2 for measurement by the alignment system AS prior to exposure using patterned radiation projected by the projection system PL.

An interferometer (not depicted) and/or other position measurement means may be used to monitor the position of the substrate table WT1 during alignment measurements. A processor PR may receive data from the alignment system AS and also receive substrate table WT1 position information. Since the substrate W is fixed on the substrate table WT1, position information relating to the substrate table may be taken as being position information relating to the substrate.

The projection system PL comprises optical elements such as, for example, lenses. Optical aberrations may arise from imperfections in projection system PL optical elements. Optical aberrations may also arise from projection effects such as, for example, the heating of optical elements that occurs during a lithographic exposure. The term 'optical aberrations' as used herein takes its ordinary meaning, indicating a departure in performance of the optical element from a paraxial approximation. Optical aberrations may result in projection errors such as, for example, overlay errors and/or focus errors. The alignment of an image to its intended position on a substrate may be referred to as overlay. Inaccuracies in the alignment of an image to its intended position on a substrate W2 may be known as overlay errors. The projection of an image onto a substrate takes place with the image at an intended focus with respect to the substrate. Deviations from the intended focus of an image on a substrate may be known as focus errors. Optical aberrations present in the projection system PL may be measured by methods that will be well known to those skilled in the art. Details of the measured optical aberrations may be stored on suitable storage media such as hard disk drives. For example, a controller 10 may measure, or receive measurements of, optical aberrations of the projection system PL. The controller 10 may comprise or be connected to suitable storage media for storage of measured optical aberrations of the projection system PL for use in further processing described in more detail below.

Figure 2A:
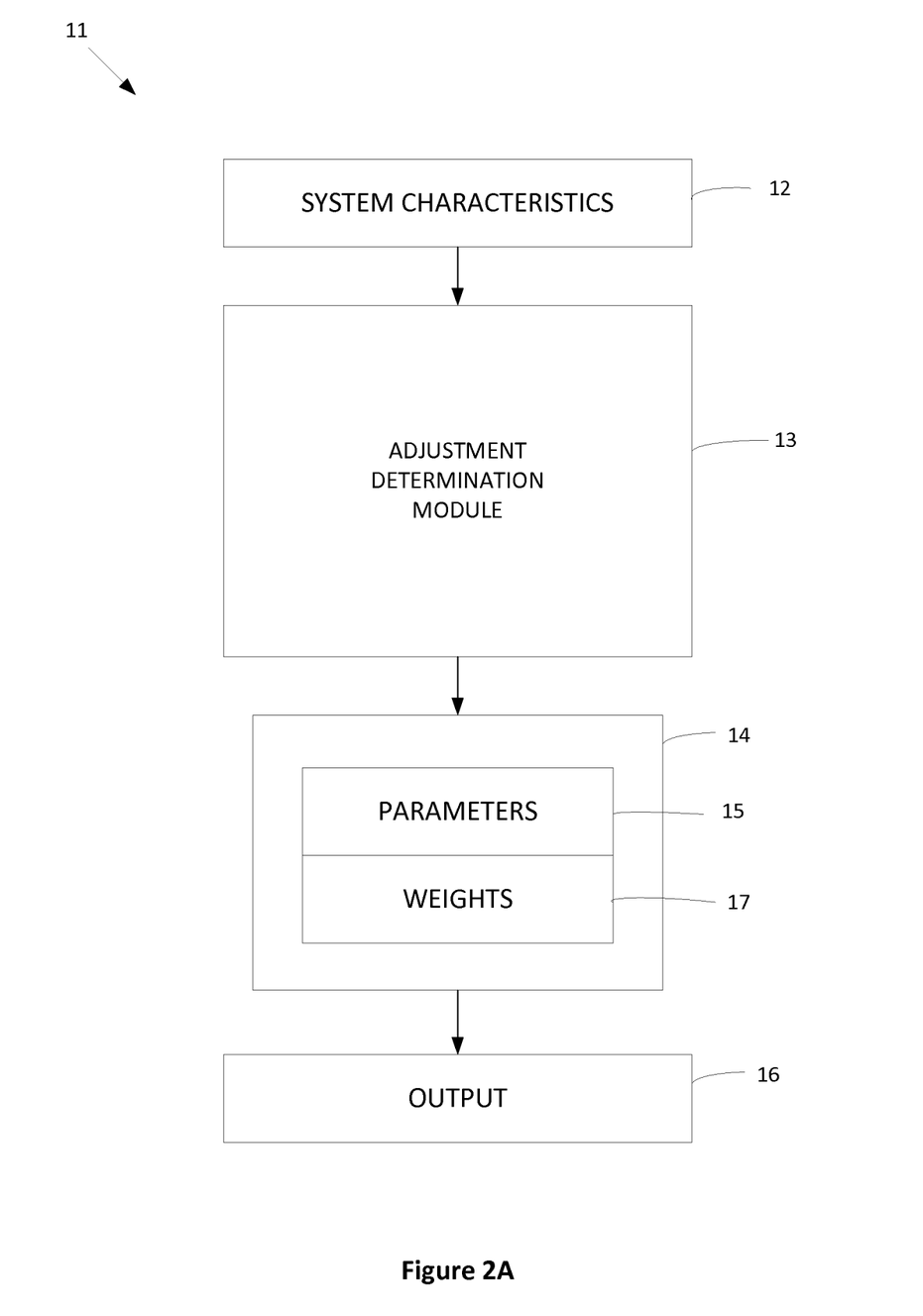
FIG. 2A is a schematic illustration of a projection system model according to a described example.
Figure 2B:
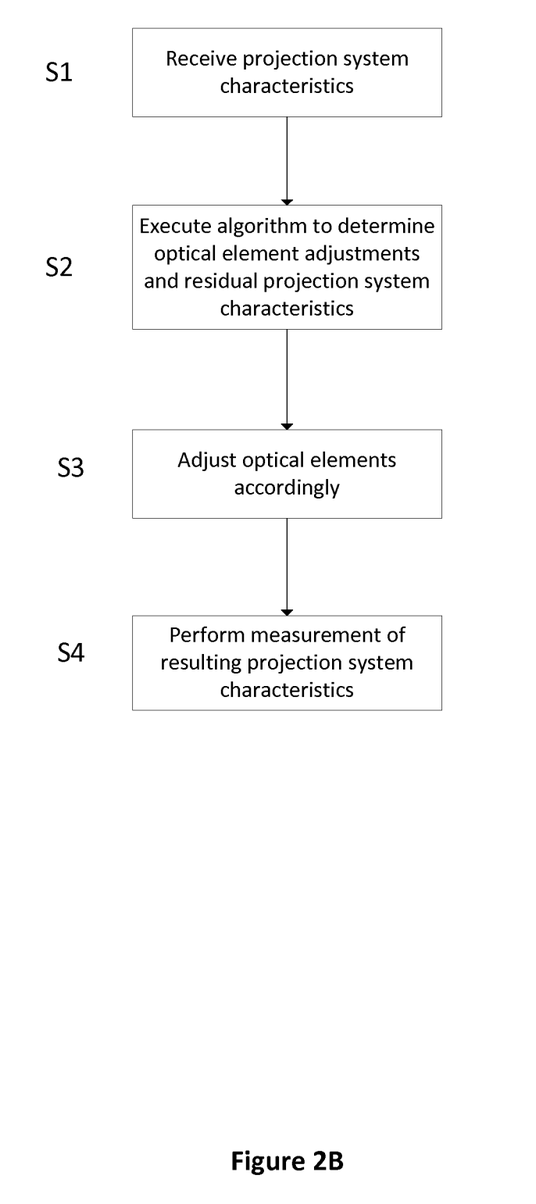
FIG. 2B is a flowchart of a projection system model according to a described example.

A projection system model 11 (schematically depicted in FIG. 2A) may be used to determine one or more adjustments (referred to herein as optical element adjustments) that may be made to one or more of the optical elements of the projection system PL. The determined adjustments may have the effect of reducing optical aberrations within the projection system PL. The determined adjustments may have the effect of changing the optical aberrations such that the optical aberrations approach and/or reach a pre-determined set of non-zero optical aberrations. The projection system model 11 may comprise one or more computer programs operable on one or more computers, such as the controller 10. FIG. 2B is a flowchart of processing that may be carried out during use of an exemplary projection system model 11. The processing of FIG. 2B may be carried out by, for example, the controller 10, or by another computer system (not shown). In step S1 the projection system model 11 receives input in the form of projection system characteristics 12. The projection system characteristics 12 may comprise characteristics such as, for example, information relating to existing optical aberrations in the projection system PL (which may have been determined through suitable measurement, e.g. using a detector arrangement or by performing an exposure in a resist, or which may be known a priori, e.g. the characteristics may have been predicted using a model). The projection system characteristics 12 may comprise other characteristics such as, for example, optical element adjustment constraints (e.g., constraints on the type and/or magnitude of mechanical adjustments that may be made to one or more of the optical elements within the projection system PL), overlay errors, and focus errors. Other projection system characteristics will be apparent to the skilled person from the teaching herein. The projection system characteristics 12 provided to the projection system model may take the form of, for example, a numerical vector or a matrix, although it will be understood that the projection system characteristics may take any form.

Information relating to existing optical aberrations in the projection system PL may be represented as wavefront data in the form of Zernike polynomials. Zernike polynomials are a set of polynomials that are orthogonal in a continuous manner on a unit disk. Zernike polynomials are used to represent wavefront data because they have a corresponding mathematical form to optical aberrations that occur in optical systems. Different Zernike polynomials represent different types of optical aberrations. For example, a first Zernike polynomial may represent a piston aberration whereas another Zernike polynomial may represent a spherical aberration. Zernike polynomials are often categorized as being either odd or even. Different categories of Zernike polynomials may correspond to different projection system characteristics. For example, even Zernike polynomials may correspond to focus errors whereas odd Zernike polynomials may correspond to overlay errors. In general, the Zernike polynomials may be categorized in any desired manner. Considering a larger number of Zernike polynomials provides more information about optical aberrations present in an optical system such as the projection system PL. Considering a larger number of Zernike polynomials provides more information about how different optical aberrations may be induced within the projection system PL via adjustments made to optical elements present within the projection system PL. For example, the first 64 Zernike polynomials may be considered for a thorough understanding of an optical system. Alternatively, 32 or 18 Zernike polynomials may be considered. Generally, it will be appreciated that any number of Zernike polynomials may be considered. Information relating to existing optical aberrations in the projection system PL may be represented in different ways e.g. in the form of orientation Zernike polynomials.

After receiving the projection system characteristics 12 at step S1, processing passes to step S2, wherein an adjustment determination module 13 of the projection system model 11 determines optical element adjustments that may be applied to the projection system PL in order to improve the projection system characteristics. The determination of optical element adjustments at step S2 may be by way of one or more of a number of techniques. Generally, the adjustment determination module 13 attempts to compensate for the existing optical aberrations of the projection system PL by determining one or more optical element adjustments which, when made, induce further optical aberrations within the projection system PL, which act to correct for the existing optical aberrations. The one or more techniques executed by the adjustment determination module 13 may involve, for example, single value decomposition, Tikhonov regularization, linear programming, quadratic programming, and other techniques as will be apparent to the skilled person from the foregoing. An output 16 of the projection system model 11 may comprise one or more optical element adjustments which, if applied to the projection system PL, induce further optical aberrations to reduce the existing optical aberrations. An output 16 of the projection system model 11 may comprise residual projection system characteristics that are expected to be present after the determined optical element adjustments have been made.

The projection system PL may comprise any number of optical elements. The projection system PL may, for example, comprise between 4 and 20 optical elements. The projection system PL may comprise 15 optical elements. The projection system PL may comprise more than 20 optical elements. Different optical elements may be subject to different optical element adjustments. Different optical elements may have different manipulation constraints. That is, different optical elements in the projection system may have different restrictions on the type and extent of adjustments available to them such as, for example, movement in the x, y and z directions, rotations, compressions, etc. Different optical elements in the projection system may therefore have different extents to which they are able to correct for optical aberrations present in the projection system PL. In general, increasing the number of optical elements and/or the type of optical element adjustments available and/or the extent of optical element adjustments available may increase the number of degrees of freedom associated with the projection system model 11. Optical aberrations present in an optical element may be coupled to each other in complex ways. Adjusting an optical element to correct for one optical aberration may induce unwanted changes in one or more other optical aberrations present in the optical element.

The projection system model 11 has a target which defines the desired projection system characteristics for the projection system PL. The projection system model attempts to achieve the target by determining optical element adjustments. The projection system model uses a merit function 14 to determine optical element adjustments. The merit function 14 comprises a set of parameters 15 which may be adjusted to provide different merit functions. For example, a dominant parameter 15 of the merit function 14 may be a least square term expressed as a weighted sum of Zernike polynomials. In one example, the merit function 14 of the projection system model 11 may take the following form:

$$(A_m - A_c)^2 + (x) + (y) + (z) + \ldots$$

Where $A_m$ is a measured (or known) optical aberration, $A_c$ is a further optical aberration induced by the optical element adjustments calculated by the adjustment determination module 13 and x, y and z represent other parameters in the merit function 14. The other parameters may comprise functions of other projection system characteristics such as, for example, optical element adjustment constraints, other functions of Zernike polynomials, root mean square wavefront errors, overlay errors, etc. The z term is followed by an ellipsis to indicate that more than three additional parameters 15 may be included within the merit function 14. The other parameters may, for example, comprise Tikhonov variables that may be related to the extent of the optical element adjustments output 16 by the projection system model. The other parameters may, for example, comprise Gembicki variables that may be related to the behaviour of different Zernike polynomials across an exposure slit or "field" of the lithographic apparatus. That is, different parts of the radiation beam PB exit the exposure slit at different points along the exposure slit and subsequently travel through different parts of the projection system PL which may have different optical aberrations. For example, the Gembicki variables may be related to a maximum value of a Zernike polynomial across the field. The parameters may be related to different techniques used in the adjustment determination model, e.g. one parameter may determine the number of iterations that are performed during single value decomposition. In general, the parameters 15 may comprise functions of any projection system characteristics. The functions may take any form, such as, for example, linear functions, quadratic functions, etc. Some parameters 15 may comprise terms that may be linearly added to the merit function. Some parameters 15 may comprise terms that may be non-linearly added to the merit function.

After determining one or more optical element adjustments at step S2, processing passes to step S3, in which the optical element adjustments determined by the projection system model are utilized. At step S3 the optical element adjustments may be provided to one or more actuators (not shown in FIG. 1) within the projection system PL which are configured to perform the determined optical element adjustments. An arrow from the controller 10 to the projection system PL in FIG. 1 schematically illustrates the passing of optical element adjustments from the controller 10 to the one or more actuators of the projection system PL. Processing passes from step S3 to step S4, in which a measurement of the projection system characteristics that have resulted from the optical element adjustments is performed. The measurement may, for example, be performed using a detector arrangement. The measurement may, for example, involve performing a lithographic exposure with the projection system PL and analysing the resulting overlay errors and focus errors etc. The process depicted by FIG. 2B may be executed again if the results of the measurement of the projection system characteristics are undesirable, e.g. if the overlay errors present are greater than a pre-determined limit. That is, the resulting projection system characteristics may be fed back into the projection system model 11 at step S1 and the process may be repeated.

The parameters 15 of the merit function 14 may have associated mathematical weights 17. A weight 17 may represent the importance of a parameter 15 to the projection system model 11. That is, for example, the larger the weight 14 that is assigned to a particular Zernike polynomial, the more the adjustment determination module 13 will attempt to reduce that Zernike polynomial, and thus its associated optical aberration. The other parameters 15 may, for example, comprise numerical weights 17 that may be assigned to terms that represent dynamic (or "fading") effects that occur during a lithographic exposure (e.g. radiation exiting different positions along an exposure slit may experience different effects when travelling through the projection system PL). The other parameters 15 may, for example, comprise weights 17 assigned to Gembicki variables and/or Tikhonov variables. In general, any projection system characteristic may have a weight 17 assigned to it.

Different projection system model merit function parameters 15 may be coupled to each other in unknown and unpredictable ways. For example, adjusting optical elements to reduce one Zernike polynomial may increase one or more other Zernike polynomials. That is, one optical aberration present in the projection system PL may be reduced with one or more optical element adjustments that also result in an undesirable increase of one or more other optical aberrations. Other parameters 15 of the projection system model 11 may also be unpredictably affected by the minimization of one or more particular Zernike polynomials. For example, minimising a particular Zernike polynomial may have the unintended consequence of increasing a focus error associated with the projection system PL.

The target of the projection system model 11 (against which the merit function 14 judges outputs of the adjustment determination module 13) may involve different constraints. For example, a target of the projection system model 11 may be to achieve minimum optical aberrations. As a further example, the target of the projection system model 11 may be to achieve minimum optical aberrations whilst also constraining the number of optical element adjustments needed to achieve those optical aberrations below a defined threshold. As yet another example, the target of the projection system model may be to minimise multiple Zernike polynomials, e.g. 64 Zernike polynomials, in order to reduce overlay errors whilst also minimising any errors (such as, for example, focus errors) that are affected by the minimisation of the Zernike polynomials.

Given the unknown and unpredictable ways in which different parameters 15 and the different constraints of the projection system model 11 are coupled, a solution space of the projection system model 11 may be complex. The manner in which weights 17 are assigned to different parameters 15 may affect how well the projection system model 11 can search the complex solution space and thus ultimately affect the quality of the output 16 provided by the projection system model 11. Known projection system models assign weights 17 to parameters 15 in a simplistic manner. For example, each odd Zernike may be assigned a weight 17 of 1 whereas each even Zernike may be assigned a weight 17 of 0. As another example, each odd Zernike may be assigned a weight 17 of 2, each even Zernike may be assigned a weight 17 of 4 and each higher order Zernike may be assigned a weight 16 of 3. These weights 16 are generally chosen for their simplicity and convenience.

In embodiments described herein, an optimization algorithm may be used to search for projection system model merit function parameters 15 and their associated weights 17 that accurately represent the complex solution space of the projection system model 11. The optimization algorithm may, for example, be an evolutionary algorithm. The optimization algorithm may comprise an algorithm that involves techniques such as, for example, simulated annealing or quadratic programming.

Figure 3:
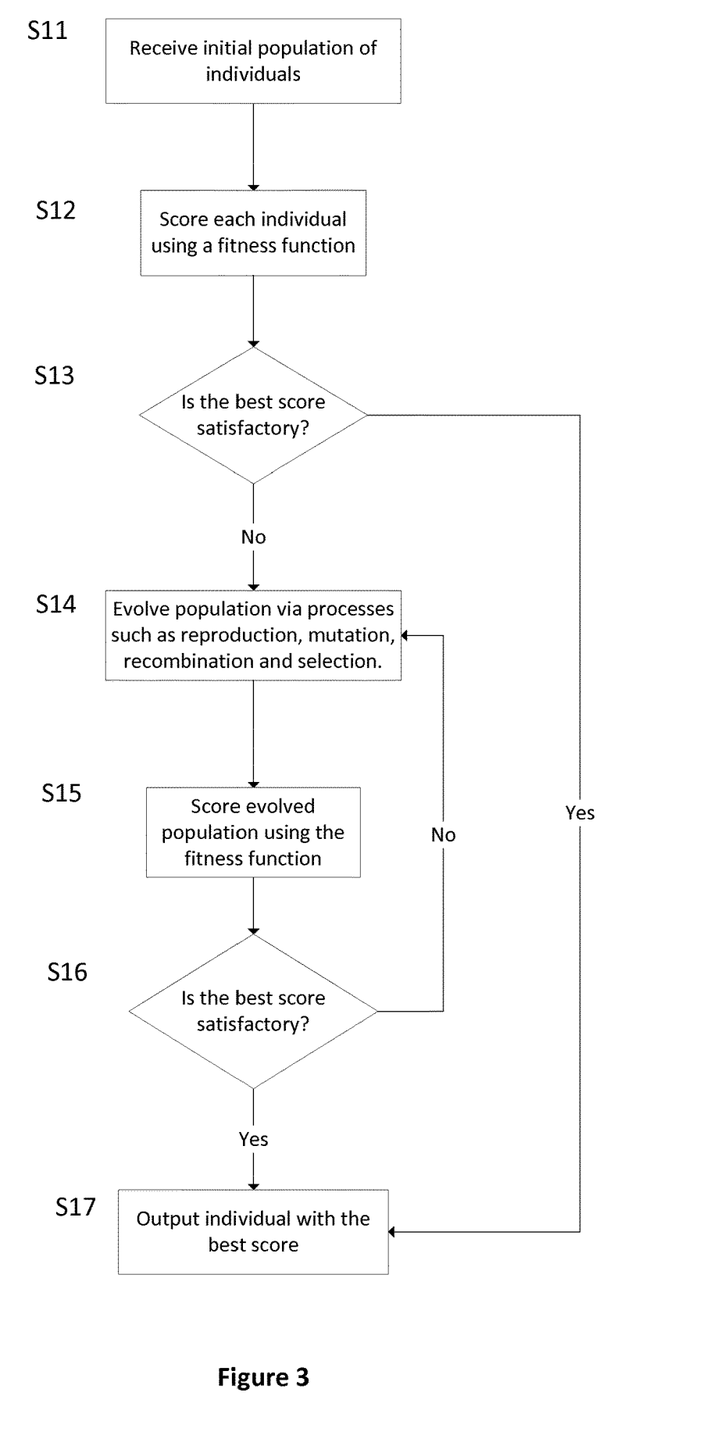
FIG. 3 is a flowchart of an evolutionary algorithm which may be used in a described example.

FIG. 3 is a flowchart of a known, general evolutionary algorithm. In step S11 the evolutionary algorithm receives an initial population of individuals. Each individual represents one possible set of values that may be used as a solution to a posed problem. For example, if the posed problem is to find an improved set of weights 17 to be assigned to Zernike polynomials in the projection system model merit function 14, then each individual in the population may represent a set of weights 17 that may be assigned to Zernike polynomials in the parameters 15. An individual may comprise other values. For example, an individual may comprise a set of numerical weights 17 that are to be assigned to other projection system characteristics such as, for example, overlay errors or optical element adjustment constraints that may be present in the parameters 15. An individual may comprise a set of numerical weights 17 that are to be used for other purposes in the projection system model merit function 14. An individual may, for example, comprise terms that may be added to the projection system model merit function 14 in order to provide a solution for a specific problem (e.g. to provide unique optical aberrations required for a particular lithographic exposure). In general the individuals may comprise any parameters and/or weights involved in the merit function 14 of the projection system model 11.

Processing passes from step S11 to step S12. The evolutionary algorithm comprises a fitness function. The fitness function determines how appropriate (or "fit") an individual is for solving the posed problem. The posed problem may be how to improve the ability of the projection system model 11 to search the complex solution space such that the projection system model 11 may provide an improved set of optical element adjustments. In step S12 the fitness function provides a score for each individual of the initial population that reflects how good a solution each individual is for the posed problem according to the fitness function. It will be appreciated that the particular way in which the fitness function operates will depend upon the nature of the problem that the evolutionary algorithm is to solve. In one example embodiment, step S12 may correspond with the process depicted in FIG. 2B. That is, the fitness function may determine how good a merit function of the projection system model 11 is by assessing the projection system characteristics that result from the output 16 of the projection system model 11.

In step S13 the score that was assigned by the fitness function to the best individual of the initial population is evaluated to see if it is satisfactory. If the score assigned to the best individual of a population is satisfactory then the best individual is output as the desired solution to the posed problem. If the score assigned to the best individual of the initial population is not satisfactory then the population is evolved until a next generation population is produced. Whether a score is satisfactory or not may be determined on comparison with a pre-determined score. Alternatively the evolutionary algorithm may output the best individual of a population after a pre-determined time or after a pre-determined number of generations have been produced or after a pre-determined number of evolutionary processes have been applied to the populations. The evolutionary algorithm may output the best individual of a population after any desired limit is reached and/or any desired result is achieved.

In step S14 the evolutionary algorithm "evolves" the population of individuals via known processes such as reproduction, mutation, recombination and selection. For example, the individuals with the best scores may be selected for reproduction with each other to produce new individuals. New individuals may be produced via an existing individual experiencing a random change, i.e. a mutation. New individuals may be produced via recombination occurring between more than one parent individual. The evolutionary algorithm repeats these processes until a next generation population of individuals is produced. The processes may be repeated for a pre-determined amount of time. The processes may be repeated until a pre-determined number of processes is reached. The processes may be repeated until a pre-determined number of populations have been generated.

In step S15 the fitness function provides a score for each individual of the next generation population. For example, the process depicted in FIG. 2B may be performed using a merit function determined by the evolutionary algorithm and the output may be assessed using the fitness function. In step S16 the score that was assigned by the fitness function to the best individual of the population is evaluated to see if it is satisfactory. If the score assigned to the best individual of a population is not satisfactory then processing returns to step S14 and the population is evolved again until a "next generation" population is produced. If the score assigned to the best individual of a population is satisfactory then processing passes to step S17 and the best individual is output as the desired solution to the posed problem.

Figure 4:
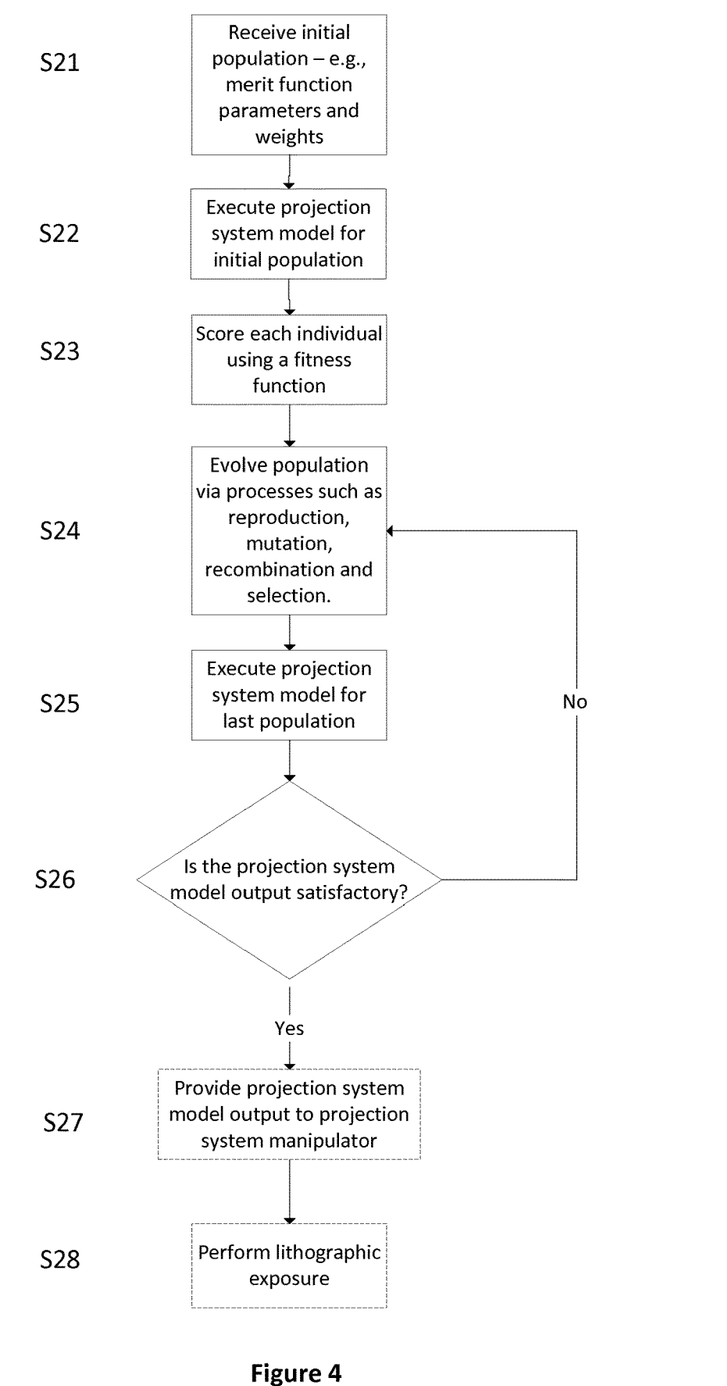
FIG. 4 is a flowchart of a projection system modelling method according to a described example.

FIG. 4 is a flowchart of an example of a method that may be used to obtain a merit function 14 of a projection system model 11. In step S21, an initial population of individuals is received. In the present example, each individual is a set of projection system model merit function parameters and associated weights. The initial population provided to the evolutionary algorithm may comprise individuals that each represent a 'simplistic' (i.e., non-optimized, naïve, or arbitrary) set of Zernike weights. For example, the initial population may comprise individuals that are currently or have previously been used within the projection system PL. A first individual of the initial population may, for example, include a weight of 1 for odd Zernike polynomials, a weight of 2 for even Zernike polynomials and a weight of 3 for higher order Zernike polynomials. A second individual of the initial population may, for example, include a weight of 5 for odd Zernike polynomials, a weight of 10 for even Zernike polynomials and a weight of 0 for higher order Zernike polynomials. The Zernike polynomials may be categorized in different ways and each category may be assigned a different weight.

An evolutionary algorithm is then applied to the received initial population. The process applied by the evolutionary algorithm may, in an example, be similar to that described above with reference to in FIG. 3. In more detail, processing passes from step S21 to step S22, wherein the projection system model 11 is executed for the initial population. At step S23, the initial population is scored based on a fitness function of the evolutionary algorithm. The fitness function of the evolutionary algorithm is a function of the projection system model 11. In the depicted example, the fitness function of the evolutionary algorithm is based upon the output of the projection system model 11. That is, the fitness function of the evolutionary algorithm scores individuals of each population based upon how close the outputs 16 of the projection system model 11, using a merit function 14 based upon that individual, are to a target.

Processing passes from step S23 to step S24 at which a new population of individuals is evolved as described above with reference to FIG. 3.

In step S25 the projection system model is executed again for the current generation population. The process applied by the projection system model may, for example, as described above with reference to FIG. 2.

As at step S26, it is determined whether an individual of the current generation is satisfactory. As at step S23, the fitness function may score an individual by analyzing the output 16 of the projection system model 11 when using a merit function 14 based on the individual with reference to a target. For example, the residual aberrations output by the projection system model 11 may be assessed and potential improvements to the projection system characteristics evaluated to determine whether or not the projection system is now capable of performing a desired lithographic exposure with desired characteristics. If it is determined, at step S26, that no individual in the current generation produces an output 16 that is satisfactory, processing may return to step S24 and a new population evolved. If, on the other hand, it is determined at step S26 that the output 16 of the projection system model 11 is satisfactory for one individual of the current generation then the evolutionary algorithm may end.

The fitness function of the evolutionary algorithm may be evaluated using the output 16 of the projection system model 11. That is, if the output 16 of the projection system model 11 is unsatisfactory then the fitness function of the evolutionary algorithm may be changed. The evolutionary algorithm may output a set of optimal solutions in the form of a Pareto front. That is, the evolutionary algorithm may output a Pareto front of merit functions that are each optimal in different respects. For example, a first merit function in the Pareto front may enable the projection system model to minimize a first Zernike polynomial whereas a second merit function in the Pareto front may enable the projection system model to minimize a second Zernike polynomial.

In some embodiments, as shown in step S27 of FIG. 4, the projection system model output 16 obtained using the merit function 14 that includes a chosen individual from the evolutionary algorithm may be provided to the projection system PL to manipulate the optical elements of the projection system PL in accordance with the determined optical element adjustments. Step S27 is depicted in dashed outline to indicate that this step is optional within the example processing of FIG. 4.

Additionally, following adjustment of the projection system, in step S28 a lithographic exposure may be performed. The projection system characteristics may have improved due to the optical element adjustments calculated by the projection system model 11 with the improved merit function 14. The results of the lithographic exposure may therefore be improved compared to a lithographic exposure performed prior to the optical element adjustments. For example, a post-adjustment exposure may have smaller overlay errors, fewer optical element adjustments, and reduced focus errors, among other improvements.

The design of the fitness function of the evolutionary algorithm is important to produce good solutions. The design of the fitness function depends on the parameters and/or weights of the projection system model that are provided to the evolutionary algorithm. The fitness function may, for example, be designed around optical aberrations and Zernike weights that are provided to the projection system model. The fitness function may be designed around projection system characteristics that can be determined from the output of the projection system model, e.g. overlay errors or a root mean square sum of wavefront errors. The fitness function may be changed in accordance with a change in the target of the projection system model 11. For example, in a first case a target of the projection system model may be to reduce a specific Zernike polynomial more so than other Zernike polynomials whereas in a second case the target of the projection system model may be to reduce the overlay error in a specific direction across a substrate. The fitness function may be different for these two cases and for other cases.

The fitness function may change between different iterations of the evolutionary algorithm in order to achieve different results. For example, the evolutionary algorithm may be executed with a first fitness function that aims to minimize a first Zernike polynomial. Once a satisfactory result is achieved by the projection system model, the evolutionary algorithm may be executed with a second fitness function that aims to minimize a second Zernike polynomial without negatively affecting the first Zernike polynomial.

Figure 5:
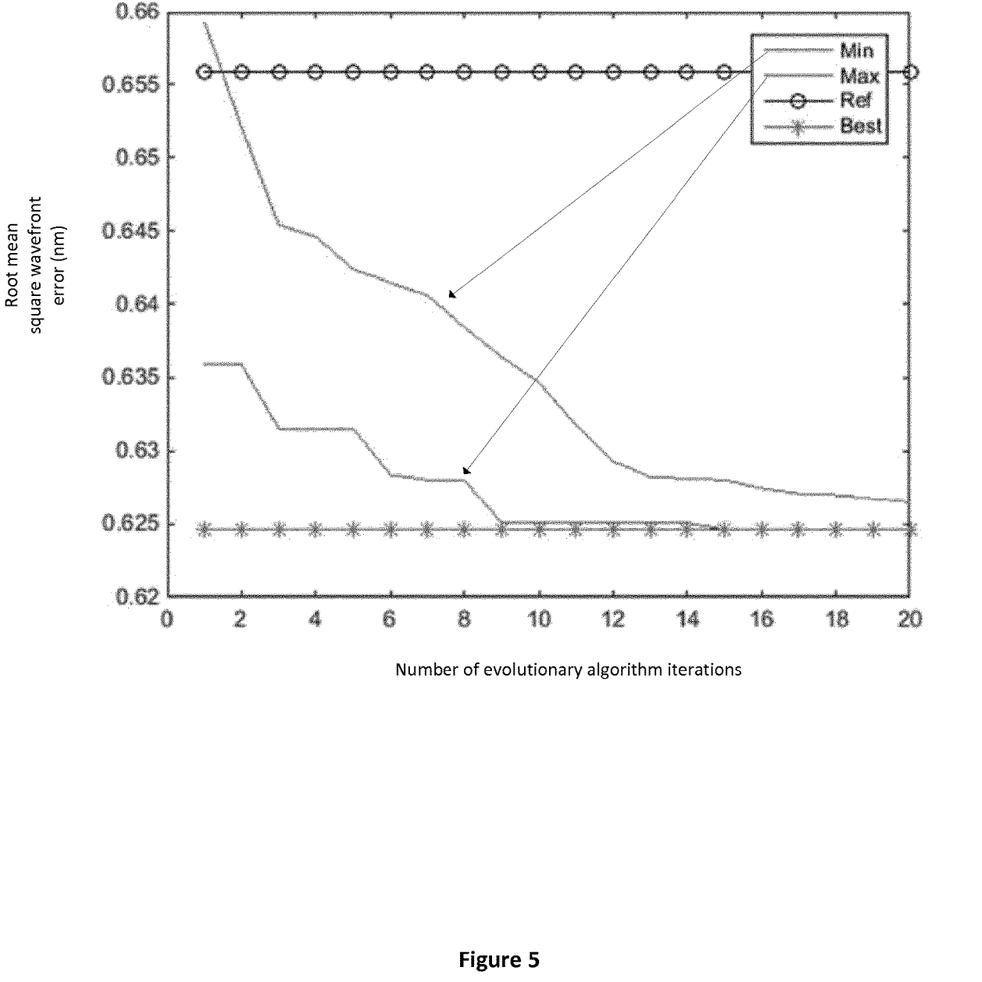
FIG. 5 is a graph of a projection system characteristic changing as a result of applying a projection system modelling method according to a described example.

FIG. 5 is a graph showing improved projection system characteristics as a result of applying the projection system modelling method described herein. The graph plots a simulated root mean square wavefront error against the number of evolutionary algorithm iterations that have taken place. The root mean square wavefront error represents the deviation of a wavefront from an ideal spherical wavefront as averaged across the entire wavefront. Deviations of a wavefront from its ideal form may be caused by the presence of optical aberrations in the projection system. The line labelled "Min" represents the lowest scoring individual of a population. The line labelled "Max" represents the highest scoring individual of a population. The line labelled "Ref" represents the results achieved using the simplistic weighting method that is currently applied in projection system models. The line labelled "Best" represents the results achieved using the best individual of the final iteration of the evolutionary algorithm. It can be seen that as the number of evolutionary algorithm iterations increases the "Min" and "Max" lines converge. This is because the individuals in each successive population tend to improve as a result of the evolutionary algorithm.

The projection system modelling method described herein may be applied to determine adjustments for a single optical element or multiple optical elements. For example, during production of a projection system, individual optical elements may be calibrated before forming part of the projection system. The projection system modelling method described herein may be used to improve the calibration of individual optical elements. The projection system modelling method described herein may be applied for different layers and/or different features of a device created using a lithographic apparatus in order to improve the projection system characteristics for those particular layers and/or features.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The illumination optics, optics and detection optics may encompass various types of optical components, including refractive, reflective, and catadioptric optical components for directing, shaping, or controlling the beam of radiation.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A computer implemented method for modeling a projection system with a projection system model, the projection system model being configured to predict optical aberrations of the projection system based upon a set of projection system characteristics and to determine and output a set of optical element adjustments based upon a merit function, the merit function comprising a set of parameters and corresponding weights, the method comprising:
   receiving an initial merit function comprising an initial set of parameters and weights;
   determining a second merit function by executing an optimization algorithm starting from the initial set of parameters and weights of the first merit function, the second merit function comprising a second set of parameters and weights, the optimization algorithm scoring different sets of parameters and weights based upon projection system characteristics of the projection system adjusted according to the output of the projection system model using a merit function having the second set of parameters and weights; and
   adjusting the projection system using the optical element adjustments output by the projection system model when executed using the second merit function.

2. The method of claim 1, wherein the optimization algorithm is an evolutionary algorithm having a fitness function, the fitness function being configured to perform the scoring of different sets of parameters and weights.

3. The method of claim 2, wherein the fitness function is evaluated or changed based upon an output of the projection system model when executed using the second merit function.

4. The method of claim 1, wherein the parameters comprise terms that are added to the merit function.

5. The method of claim 1, wherein at least some of the weights are assigned to Zernike polynomials or Tikhonov variables or Gembicki variables.

6. The method of claim 1, wherein the optimization algorithm determines a Pareto front comprising multiple merit functions, the Pareto front including the second set of parameters and weights.

7. The method of claim 1, wherein the method is applied for adjusting individual optical elements of the projection system.

8. A method for controlling a lithographic apparatus, the lithographic apparatus comprising a projection system, the method comprising:
   generating a set of projection system adjustments using a method for modeling a projection system with a projection system model, the projection system model being configured to predict optical aberrations of the projection system based upon a set of projection system characteristics and to determine and output a set of optical element adjustments based upon a merit function, the merit function comprising a set of parameters and corresponding weights;
   receiving an initial merit function comprising an initial set of parameters and weights;
   determining a second merit function by executing an optimization algorithm starting from the initial set of parameters and weights of the first merit function, the second merit function comprising a second set of parameters and weights, the optimization algorithm scoring different sets of parameters and weights based upon the projection system characteristics of a projection system adjusted according to the output of the projection system model using a merit function having the second set of parameters and weights; and adjusting the projection system using the optical element adjustments output by the projection system model when executed using the second merit function; and adjusting the projection system of the lithographic apparatus in accordance with the projection system adjustments.

9. The method of claim 8, further comprising performing a lithographic exposure on a substrate using the lithographic apparatus after adjusting the projection system.

10. The method of claim 9, wherein the method is used for different features that are to be printed on the substrate or different layers of the substrate.

11. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the lithographic apparatus further comprises one or more controllers configured to perform an operation for modeling the projection system with a projection system model, the projection system model being configured to predict optical aberrations of the projection system based upon a set of projection system characteristics and determine and output a set of optical element adjustments based upon a merit function, the merit function comprising a set of parameters and corresponding weights, the controllers configured to:

receive an initial merit function comprising an initial set of parameters and weights;

determine a second merit function by executing an optimization algorithm starting from the initial set of parameters and weights of the first merit function, the second merit function comprising a second set of parameters and weights, the optimization algorithm scoring different sets of parameters and weights based upon projection system characteristics of a projection system adjusted according to the output of the projection system model using a merit function having the second set of parameters and weights; and adjust the projection system using the optical element adjustments output by the projection system model when executed using the second merit function.

12. A computer program product comprising a non-transitory computer readable medium having instructions recorded thereon, the instructions when executed by a computer cause the computer to perform operations comprising modeling a projection system with a projection system model, the projection system model being configured to predict optical aberrations of the projection system based upon a set of projection system characteristics and determine and output a set of optical element adjustments based upon a merit function, the merit function comprising a set of parameters and corresponding weights, the operations also comprising:

receiving an initial merit function comprising an initial set of parameters and weights;

determining a second merit function by executing an optimization algorithm starting from the initial set of parameters and weights of the first merit function, and the second set of parameters and weights, the optimization algorithm scoring different sets of parameters and weights based upon projection system characteristics of the projection system adjusted according to the output of the projection system model using a merit function having the second set of parameters and weights; and adjusting the projection system using the optical element adjustments output by the projection system model when executed using the second merit function.

\* \* \* \* \*

UNITED STATES PATENT AND TRADEMARK OFFICE
CERTIFICATE OF CORRECTION

PATENT NO. : 10,678,143 B2  
APPLICATION NO. : 16/307372  
DATED : June 9, 2020  
INVENTOR(S) : Imponente et al.

Page 1 of 1

It is certified that error appears in the above-identified patent and that said Letters Patent is hereby corrected as shown below:

On the Title Page

Item (56), replace "JP 2012-191018 A 10/1920" with -- JP 2012-191018 A 10/2012 --.

Signed and Sealed this
Twenty-ninth Day of June, 2021

Drew Hirshfeld
*Performing the Functions and Duties of the
Under Secretary of Commerce for Intellectual Property and
Director of the United States Patent and Trademark Office*